United States Patent
Varanasi

(10) Patent No.: US 9,030,902 B2
(45) Date of Patent: *May 12, 2015

(54) PROGRAMMING MEMORY CELLS

(71) Applicant: Micron Technology, Inc., Boise, ID (US)

(72) Inventor: Chandra C. Varanasi, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/330,243

(22) Filed: Jul. 14, 2014

(65) Prior Publication Data

US 2014/0321214 A1    Oct. 30, 2014

Related U.S. Application Data

(63) Continuation of application No. 13/106,118, filed on May 12, 2011, now Pat. No. 8,780,659.

(51) Int. Cl.
| | |
|---|---|
| *G11C 16/10* | (2006.01) |
| *G11C 7/10* | (2006.01) |
| *G11C 11/56* | (2006.01) |
| *G11C 16/04* | (2006.01) |
| *G11C 16/34* | (2006.01) |

(52) U.S. Cl.
CPC ............ *G11C 16/10* (2013.01); *G11C 7/1006* (2013.01); *G11C 11/5628* (2013.01); *G11C 16/0483* (2013.01); *G11C 16/3418* (2013.01)

(58) Field of Classification Search
USPC .............. 365/189.16, 206, 244; 714/792, 795
See application file for complete search history.

(56) References Cited

U.S. PATENT DOCUMENTS

| | | |
|---|---|---|
| 2007/0171714 A1 | 7/2007 | Wu et al. |
| 2007/0171730 A1 | 7/2007 | Ramamoorthy et al. |
| 2007/0266296 A1 | 11/2007 | Conley |
| 2009/0013233 A1 | 1/2009 | Radke |
| 2009/0129153 A1 | 5/2009 | Sarin et al. |
| 2009/0129169 A1 | 5/2009 | Roohparvar et al. |
| 2009/0132755 A1 | 5/2009 | Radke |
| 2009/0204746 A1 | 8/2009 | Chen et al. |

(Continued)

FOREIGN PATENT DOCUMENTS

| | | |
|---|---|---|
| JP | 57-099066 | 6/1982 |
| JP | 2004-310807 | 11/2004 |

(Continued)

OTHER PUBLICATIONS

Search Report for EP Application No. 12 781 748.4 mailed Oct. 27, 2014 (3 pages).

*Primary Examiner* — Huan Hoang
*Assistant Examiner* — Jay Radke
(74) *Attorney, Agent, or Firm* — Dicke, Billig & Czaja, PLLC

(57) ABSTRACT

Methods for programming memory cells. One such method for programming memory cells includes generating an encoded stream using a data stream and programming the memory cells using the encoded stream to represent the data stream. A particular bit position of the encoded stream has a first voltage level when the particular bit position of the data stream has a particular logical state, and the particular bit position of the encoded stream has either a second voltage level or a third voltage level when the particular bit position of the data stream has a logical state other than the particular logical state.

20 Claims, 5 Drawing Sheets

(56) References Cited

U.S. PATENT DOCUMENTS

| | | |
|---|---|---|
| 2010/0020619 A1* | 1/2010 | Sato .................. 365/185.24 |
| 2010/0042773 A1 | 2/2010 | Yeh |
| 2010/0299575 A1 | 11/2010 | Roth et al. |
| 2011/0289376 A1 | 11/2011 | Maccarrone et al. |

FOREIGN PATENT DOCUMENTS

| | | |
|---|---|---|
| JP | 2005-078721 | 3/2005 |
| KR | 20080048534 A | 6/2008 |
| KR | 10-2009-0110648 | 10/2009 |
| WO | 2007084749 A2 | 7/2007 |
| WO | 2007084751 A2 | 7/2007 |
| WO | 2008042593 A1 | 4/2008 |
| WO | 2009067320 A1 | 5/2009 |
| WO | 2009067448 A1 | 5/2009 |
| WO | 2010002941 A1 | 1/2010 |
| WO | 2010092536 A1 | 8/2010 |

* cited by examiner $U_K$: 1 0 0 1 0 1 0 1 1 ...

$V_K$: 1 1 1 0 0 1 1 0 1 ...

$C_K$: -1 -1 -1 1 1 -1 -1 1 -1 ...

$X_K$: 0 -2 -2 0 2 0 -2 0 0 ...

K ⟶

PROGRAMMING MEMORY CELLS

RELATED APPLICATION

This Application is a Continuation of U.S. application Ser. No. 13/106,118, titled "PROGRAMMING MEMORY CELLS," filed May 12, 2011, now U.S. Pat. No. 8,780,659 issued on Jul. 15, 2014, which is commonly assigned and incorporated herein by reference.

TECHNICAL FIELD

The present embodiments relate generally to memory and a particular embodiment relates to programming and reading memory cells.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory device is a type of memory in which the array of memory cells is typically organized into memory blocks that can be erased and reprogrammed on a block-by-block basis instead of one byte at a time. A threshold voltage of each of the memory cells determines a data value stored in each memory cell.

FIGS. 1A and 1B illustrate possible program states of typical non-volatile memory cells. FIG. 1A illustrates the possible program states of a single level cell (SLC) memory device. FIG. 1B illustrates the possible program states of a multiple level cell (MLC) memory device.

Each of the distributions in FIGS. 1A and 1B represent a threshold voltage (V) range with the number of memory cells at each threshold voltage within that particular range. Each distribution represents a particular programmable state. For example, FIG. 1A shows that the negative voltage distribution 101 represents a logical "1" state (e.g., erased state) and the positive voltage distribution 102 represents a logical "0" state (e.g., programmed state). Similarly, FIG. 1B shows that the negative voltage distribution 103 represents a logical "11" state (e.g., erased state) and the three positive voltage distributions 104-106 represent logical "10", "00", and "01" states (e.g., programmed states), respectively.

Due, at least in part, to the relatively low threshold voltages used in non-volatile memory devices, programming a memory device can be susceptible to noise. For example, referring to FIG. 1A, if −A is a voltage representing an erased state and +A is a voltage representing the programmed state, A might be in a range of 1V to 3V. Thus, noise that occurs during either programming or reading the voltages might cause the data state of the memory cell to be incorrectly programmed or incorrectly read.

For the reasons stated above and for other reasons that will become apparent to those skilled in the art upon reading and understanding the present specification, there is a need in the art for reducing the effects of noise in a memory device.

DETAILED DESCRIPTION

Figure 1A:
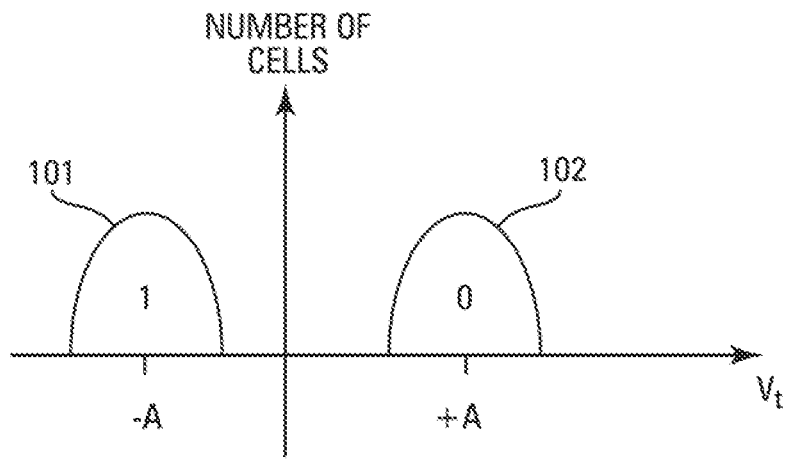
FIGS. 1A and 1B show voltage distributions for possible program states of typical non-volatile memory cells.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
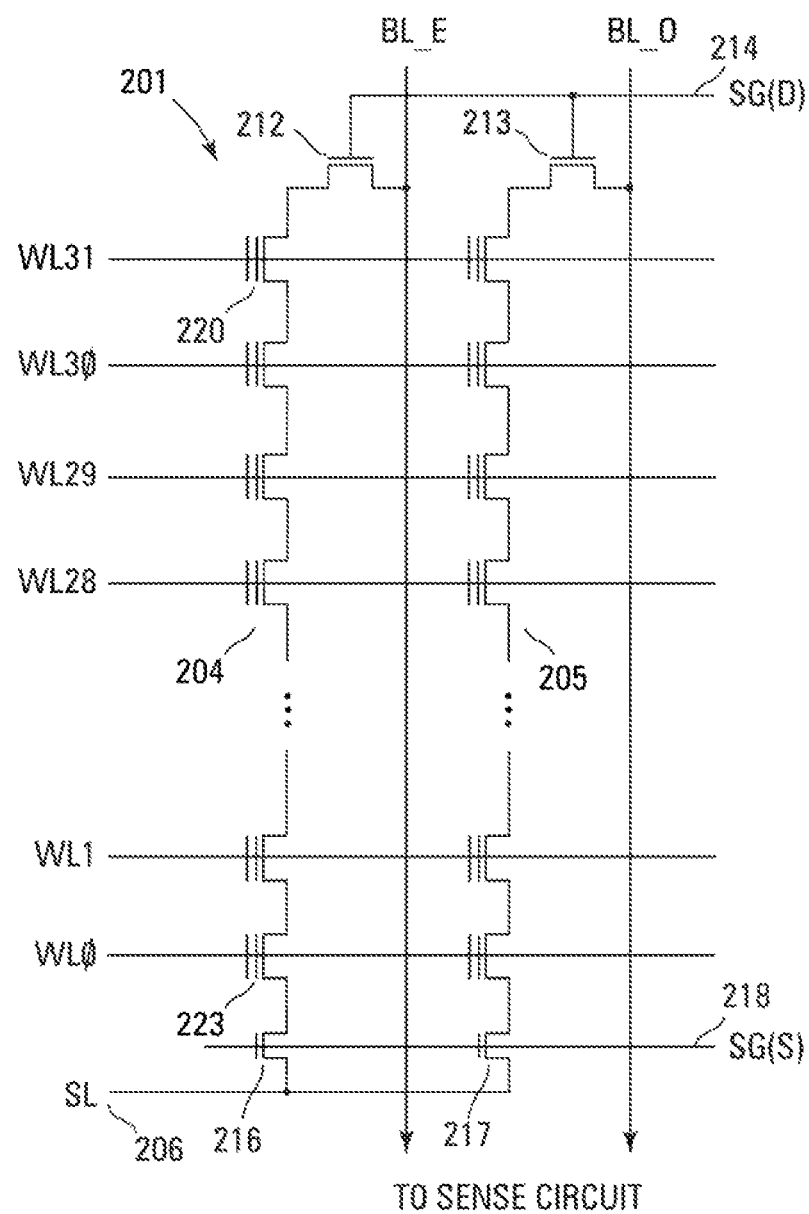
FIG. 2 shows a schematic diagram of one embodiment of a portion of a NAND architecture memory array.

FIG. 2 illustrates a schematic diagram of one embodiment of a portion of a NAND architecture memory array 201 comprising series strings of non-volatile memory cells. The schematic diagram of FIG. 2 is for purposes of illustration of one example of a programmable non-volatile memory device only. The embodiments of the method for programming are not limited to the memory array architecture illustrated. Alternate embodiments can use NOR or other architectures as well.

The memory array 201 comprises an array of non-volatile memory cells (e.g., floating gate) arranged in columns such as series strings 204, 205. Each of the cells is coupled drain to source in each series string 204, 205. An access line (e.g. word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the series strings and eventually each bit line is coupled to a page buffer with sense circuitry that detects the state of each cell by sensing current or voltage on a selected bit line.

Each series string 204, 205 of memory cells is coupled to a source line 206 by a source select gate 216, 217 (e.g., transistor) and to an individual bit line BL_E, BL_O by a drain select gate 212, 213 (e.g., transistor). The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or a multiple level cell (MLC). Each cell's threshold voltage ($V_t$) is indicative of the data state that is stored in the cell. For example, in an SLC, a $V_t$ of 2.5V might indicate a programmed cell while a $V_t$ of −2.5V might indicate an erased cell. An MLC uses multiple $V_t$ ranges that each indicates a different data state. Multilevel cells can take advantage of the analog nature of a traditional flash cell by assigning a bit pattern to a specific $V_t$ range. This technology permits the storage of data states representing two or more bits per cell, depending on the quantity of $V_t$ ranges assigned to the cell. In either case, conventional memory devices typically use a program state (e.g., represented by distributions 101 and 102, or distributions 103, 104, 105, and 106) to directly represent, in a one-to-one relationship, a data state (e.g. data states 1 and 0, or data states 11, 10, 00, and 01, respectively).

Figures 3, 4:
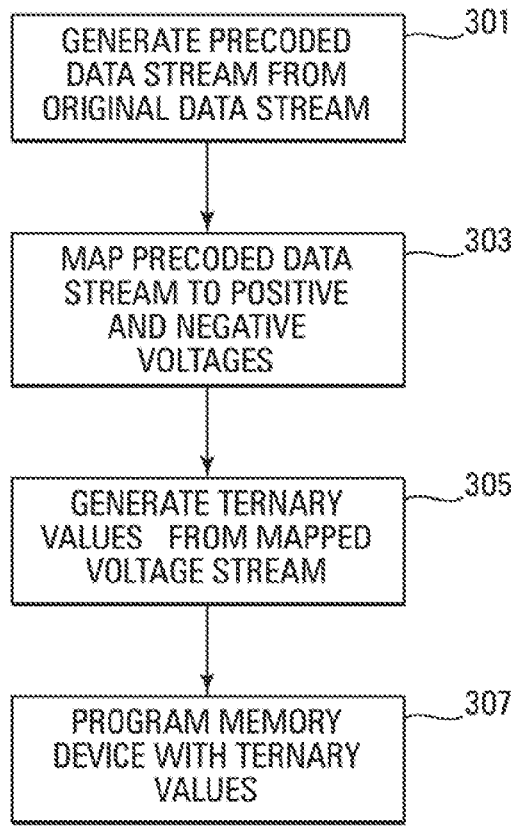
FIG. 3 shows a flowchart of one embodiment of a method for programming a memory device.
FIG. 4 shows a table of one embodiment of data and voltage streams in accordance with the method of FIG. 3.

FIG. 3 illustrates a flowchart of one embodiment of a method for programming a memory device, such as an SLC non-volatile memory device as illustrated in FIG. 2. The method starts with a data stream of bits such as illustrated as the $U_k$ data stream in FIG. 4 where 'k' is a bit position in the stream. In a typical prior art programming method, $U_k$ is the data stream that would be programmed into a memory device.

The $U_k$ data stream is used in generating a pre-coded data stream 301. The pre-coded data stream is represented in FIG. 4 as $V_k$. In one embodiment, $V_k = XOR(U_k, V_{k-1})$. In one embodiment, it is assumed that $V_k$ is initialized to a logical 0.

Using the $U_k$ data stream of FIG. 4 as an example, it can be seen that since $U_0=1$ and $V_k$ is initially 0, the new $V_0=XOR(1, 0)=1$. Similarly, $U_1=0$ and $V_0=1$ thus $V_1=1$. This pre-coding algorithm continues for the entire $U_k$ data stream to generate the pre-coded $V_k$ data stream as illustrated in FIG. 4.

The pre-coded $V_k$ data stream is used to generate a mapped voltage stream $C_k$ 303 as illustrated in FIG. 4. The pre-coded $V_k$ data stream is mapped to positive and negative voltages from the binary $V_k$ data stream. In one embodiment, as illustrated in FIG. 4, the mapping rule can map a $V_k=0$ to a first voltage (e.g., 1V) and a $V_k=1$ to a second voltage (e.g., −1V). In one embodiment, the first and second voltages have the same magnitude. This mapping continues for the entire $V_k$ data stream to generate the mapped voltage stream $C_k$ as illustrated in FIG. 4.

The mapped voltage stream $C_k$ is then used to generate an encoded stream, such as the ternary voltage stream $X_k$ 305 as illustrated in FIG. 4. In one embodiment, $X_k = \{C_k + C_{k-1}\}$. As an example, assuming the $C_k$ voltage stream in FIG. 4, $X_0 = \{-1+1\} = \{0\}$ and $X1 = \{-1-1\} = -2$. This ternary value conversion continues for the entire $C_k$ stream to generate the $X_k$ voltage stream as illustrated in FIG. 4.

The $X_k$ voltage stream is then used to program the memory device. Thus, instead of the prior art method for programming a memory cell to one of two program states (e.g., 1, 0), the programming embodiment of FIG. 3 programs one of at least three different program states (e.g., 0, −2, +2) into the SLC memory cells.

In an alternate embodiment, the ternary voltages of $X_k$ can be generated from the original data stream $U_k$ in another manner. Referring to both $U_k$ and $X_k$ in FIG. 4, it can be seen that when $U_k=0$, $X_k$ is either −2 or +2 and when $U_k=1$, $X_k=0$. Additionally, it can be seen that when $X_k$ is preceded by an odd number of logical ones in $U_k$, $X_k$ is a −2. When $X_k$ is preceded by an even number of logical ones in $U_k$, $X_k$ is a +2. The encoded $X_k$ voltage stream can thus be generated from $U_k$ by replacing a first $U_k$ logical state (e.g., logical 1) with 0V and counting the number of occurrences of the first $U_k$ logical state (e.g., logical 1) that precede the present position in $X_k$ and replacing a second $U_k$ logical state (e.g., logical 0) with −2V when the quantity of the first logical states prior to the present position is odd and +2V when the quantity of the first logical state prior to the present position is even.

The $X_k$ values of 0, −2, and +2 shown in FIG. 4 are for purposes of illustration only. A generic representation of the $X_k$ values can be 0, −A, and +A where the magnitude of A can be any voltage that is programmable into a memory cell.

In one embodiment, the ternary $X_k$ values programmed into memory cells can be read using a sequence detector that relies on individual present data samples as well as past data samples (e.g., a Viterbi detector). One embodiment of such a Viterbi detector can be illustrated by the trellis state diagram of FIG. 5.

Figure 5:
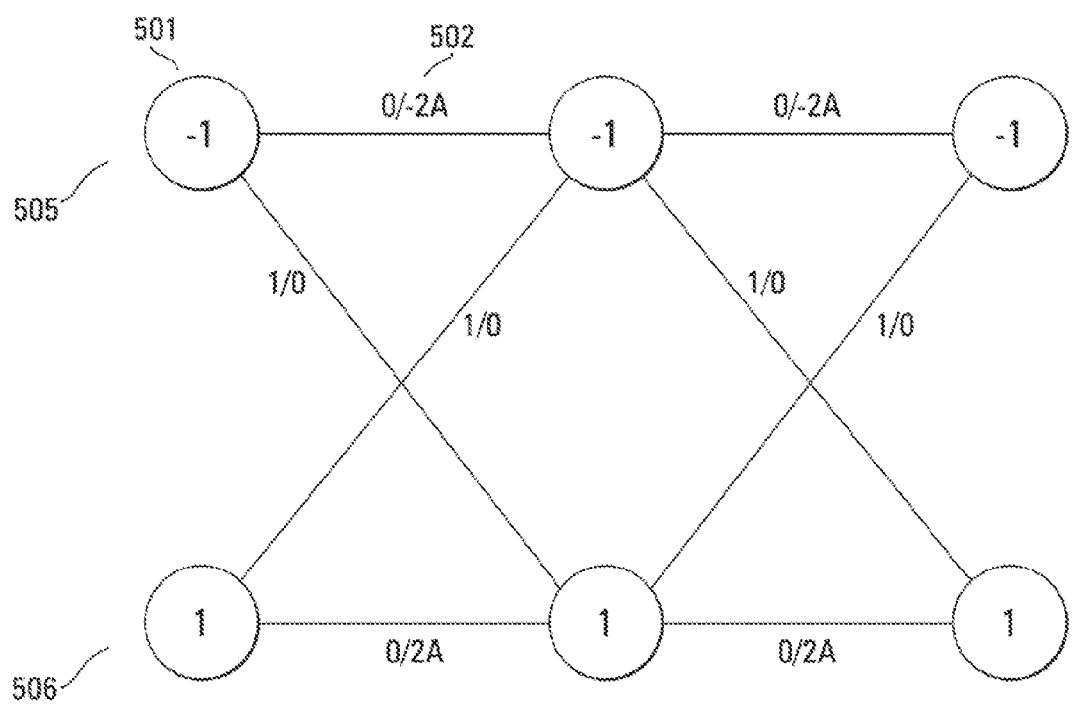
FIG. 5 shows a trellis state diagram of one embodiment of a method for reading a memory device that has been programmed with the method of FIG. 3.

The trellis state diagram of FIG. 5 illustrates the relationship between $C_k$ and $X_k$. Since $C_k$ of the embodiment of FIG. 4 shows two values (e.g., −1 and 1), the trellis is shown having two possible states (e.g., −1 and 1). Each circle 501 in the trellis represents a $C_{k-1}$ state. The lines between each $C_{k-1}$ state represent movement either to the same state (e.g., −1 to −1) or to the second state (e.g., −1 to 1). Each of these lines is labeled by the $U_k/X_k$ values 502 that trigger that movement.

An example of interpretation of the trellis state diagram refers to both the table of FIG. 4 and the trellis state diagram of FIG. 5. FIG. 4 shows that when $C_{k-1}=-1$, $U_k=0$, and $X_k=-2$ then the present state will be −1 (e.g., $C_k=-1$). This is illustrated by the top edge 505 of the trellis state diagram. Similarly, when $C_{k-1}=1$, $U_k=0$, and $X_k=2$ then the present state will be 1 (e.g., $C_k=1$). This is illustrated by the bottom edge 506 of the trellis state diagram.

The trellis state diagram of FIG. 5 also shows that when $C_{k-1}=-1$, $U_k=1$, and $X_k=0$ then the present state will be 1 (e.g., $C_k=1$). Similarly, when $C_{k-1}=1$, $U_k=1$, and $X_k=0$ then the present state will be −1 (e.g., $C_k=-1$).

Figure 1B:
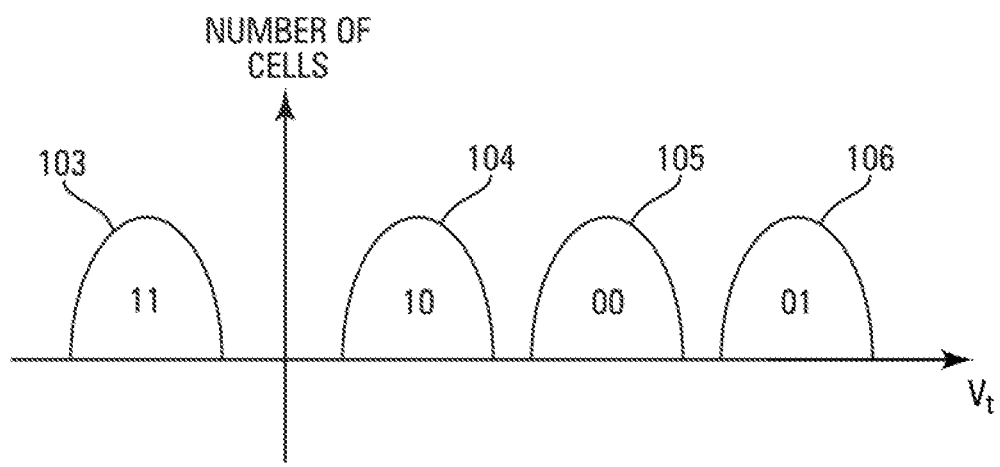

The method for programming can result in a doubling of the average energy during SLC memory programming as compared to typical prior art SLC programming. For example, assuming that the distributions for the two SLC states are centered on voltages −A and +A, as shown in FIG. 1, the average signal power of a prior art programming method is $A^2$. The average signal power of $X_k$ of the present method for programming is $(\frac{1}{2})[4A^2+0]=2A^2$ thus improving signal-to-noise ratio.

A Viterbi detector is a sequence detector. In other words, it does not make decisions about individual $U_k$ based on their individual $X_k$ outputs. Instead it relies on a sequence of past samples to make its decisions. In the following description of the Viterbi detector, $Y_k$ denotes a noisy version of $X_k$. That is, $Y_k = X_k + N_k$ where $N_k$ is the electronic noise that gets added to $X_k$ as part of the storing and retrieval process of data on non-volatile memory. At each time unit k, the Viterbi detection comprises four operations: Branch Metric Computation, Path Metric Update, Survivor Exchange, and Decision Release.

In describing the Branch Metric Computation, reference is made to the trellis state diagram of FIG. 5, each edge 505, 506 connecting a pair of states is a branch. After $Y_k$ is read from the memory, $(Y_k - X_k)^2$ is determined for each branch in that stage of the trellis. Since there are four transitions in each stage of the trellis, a trellis stage being a collection of branches connecting the states $C_{k-1}$ to state $C_k$; it describes the state of affairs at time unit k—the following four branch metrics are determined, where B1 and B2 refer to the transitions leaving State 0 and B3 and B4 refer to the transitions leaving State 1:

$B1=(Y_k+2A)^2$ $B2=(Y_k-0)^2$ $B3=(Y_k-0)^2$ $B4=(Y_k-2A)^2.$

Expanding out these quantities and discarding the noise term (Y2) from each equation results in:

$B1=4Ay_k+4A^2;$ $B2=0$ $B3=0$ $B4=-4Ay_k+4A^2.$

A quantity known as a state metric, also referred to as the path metric is associated with the two states. This quantity gets updated at each time unit k. To signify that fact, the two path metrics at time unit k are denoted by P(0, k) and P(1, k), respectively. The two path metrics are initialized to 0 at time unit 0. Then at every time unit k, for each of the two states, it is observed that there are two separate candidate paths: one from the state 0 and the other from state 1. The metrics of the two candidate paths that end at state 0 at time k are denoted by the notation CP1(0, k) and CP2(0, k) and are computed as:

$$CP1(0,k)=P(0,k-1)+B1$$

$$CP2(0,k)=P(1,k-1)+B3$$

It is then determined which of the above two candidates is smaller. The smallest candidate is chosen as the updated path to state 0 and subsequently referred to as the path-metric to state 0 at time k, P(0, k). The same operation is performed for state 1 to produce P(1, k−1). A comparison is then performed between CP1(1, k)=P(0, k−1)+B2 and CP2(1, k)=P(1, k−1)+B4. The smallest is then chosen as the updated path metric to state 1 at time k and subsequently denoted as P(1, k).

At the beginning of the decision process, an array of registers is assigned to each of the two states. These registers are typically known as a survivor array or simply survivor. The number of registers in each of the survivors is referred to as the path-memory. If the path-memory is 20, the survivor of state 0 is denoted by S0=S0(0), S0(1), . . . S0(19) and the survivor of state 1 by S1=S1(0), S1(1), . . . , S1(19).

In the Path Metric Update stage, once the updated path metric for a given state has been generated, the $U_k$ label on the chosen branch coming to that state is pushed into the corresponding survivor. For example, when generating the updated path-metric P(0, k) for state 0, if CP1(0, k) is chosen, the $U_k$ label is pushed on B1 branch (e.g., 0 into S0). If CP2(0, k) is chosen, the $U_k$ label is pushed on the B3 branch (e.g., 1 into S0).

Similarly, when generating the updated path-metric for state 1, P(1, k), if CP1(1, k) won, the $U_k$ label is pushed on branch B2 (e.g., 1 into S1). If CP2(1, k) won, the $U_k$ label is pushed on branch B4 (e.g., 0 into S1).

This process cannot go on beyond 20 time units if the path-memory is 20. It is limited by the length of the path-memory. At that point, the survivors are full and any new $U_k$ cannot be pushed into survivors. This is when Decision Release happens. The oldest content is pushed in the survivor S0(0) for state 0 and S1(0) for state 1 out of the survivor. Furthermore, all the remaining contents of each survivor are pushed back by one to the left to take advantage of the empty slot in S0(0) for state 0 and S1(0) for state 1. This creates room for the new in-coming $U_k$. The new $U_k$ is pushed into the 19th register S0(19) for State 0 and S1(19) for State 1. These now become the new survivors for each state.

Two pushed-out contents of the survivors are now available—one that was pushed out of S0 and another that was pushed out of S1. One of these two is chosen as the Decision and released. Apriori it is decided which survivor is desired from which to release decisions: S0 or S1. This survivor is used throughout for Decision Release. Since the first Decision Release occurs only after the survivors are full, there is a latency equaling Path Memory that, in this example, is 20. In other words, decision released at time 20 is about $U_0$, decision released at time 21 is about $U_1$, decision released at time 22 is about $U_2$, and so on.

In the prior art, decisions are made substantially instantaneously. In other words, as soon as $Y_k$ is observed, the corresponding $U_k$ is decided. The Viterbi detector makes decisions with delay, by considering the history of the paths traversed in coming to the present state. This makes it aware that certain paths are illegal and a correct sequence of $U_k$ would not have taken it. Instantaneous snapshot decisions might not be able to distinguish wrong paths from the correct paths because they ignore the path history. The Viterbi detector can thus provide an advantage of better noise immunity.

Figure 6:
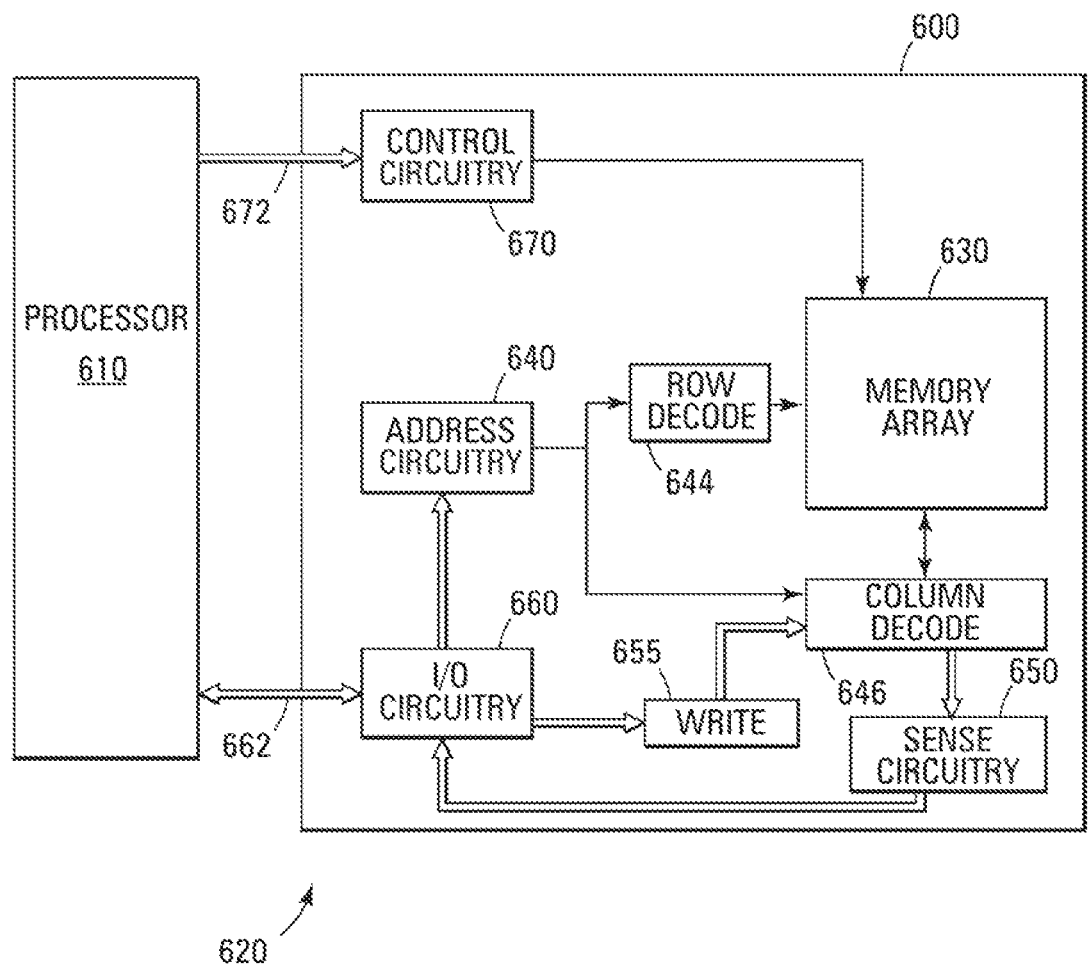
FIG. 6 shows a block diagram of one embodiment of a system that can incorporate a memory device using the described methods for sense operations.

FIG. 6 illustrates a functional block diagram of a memory device 600 that can comprise a memory array architecture such as illustrated in FIG. 2 and can be programmed using the programming methods disclosed herein. The memory device 600 is coupled to an external controller 610. The external controller 610 may be a microprocessor or some other type of controller. The memory device 600 and the external controller 610 form part of a system 620.

The memory device 600 includes an array 630 of memory cells (e.g., non-volatile memory cells). The memory array 630 is arranged in banks of word line rows and bit line columns. In one embodiment, the columns of the memory array 630 comprise series strings of memory cells.

Address buffer circuitry 640 is provided to latch address signals provided through I/O circuitry 660. Address signals are received and decoded by a row decoder 644 and a column decoder 646 to access the memory array 630.

The memory device 600 reads data in the memory array 630 by sensing voltage or current changes in the memory array columns using sense circuitry 650. The sense circuitry 650, in one embodiment, is coupled to read and latch a row of data from the memory array 630. The sense circuitry 650, as previously described, includes the sense circuitry as well as other circuits for performing a program verify operation. Data are input and output through the I/O circuitry 660 for bidirectional data communication as well as the address communication over a plurality of data connections 662 with the controller 610. Write circuitry 655 is provided to write data to the memory array.

An internal controller (e.g., control circuitry and/or firmware) 670 decodes signals provided on a control interface 672 from the external controller 610. These signals are used to control the operations on the memory array 630, including data read, data write (program), and erase operations. The internal controller 670 may be a state machine, a sequencer, or some other type of controller to generate the memory control signals. In one embodiment, the internal controller 670 is configured to control execution of the programming embodiments of the present disclosure. In an alternate embodiment, the external controller 610 is configured to control execution of the programming embodiments of the present disclosure.

The memory device illustrated in FIG. 6 has been simplified to facilitate a basic understanding of the features of the memory. A more detailed understanding of internal circuitry and functions of flash memories are known to those skilled in the art.

CONCLUSION

In summary, one or more embodiments of a program operation can provide improved signal-to-noise ratio in programming memory cells. This can be accomplished by encoding two original data states of an SLC memory device into at least three different program states, thus increasing the programmed signal power.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for programming memory cells, the method comprising:
   generating an encoded stream having three voltage levels using a data stream having only two logical states; and
   programming the memory cells using the encoded stream to represent the data stream, wherein a particular bit position of the encoded stream has a first voltage level when the particular bit position of the data stream has a particular logical state, and wherein the particular bit position of the encoded stream has either a second voltage level or a third voltage level when the particular bit position of the data stream has a logical state other than the particular logical state.

2. The method of claim 1, wherein the first voltage level is less than the second voltage level, and wherein the first voltage level is greater than the third voltage level.

3. The method of claim 2, wherein the third voltage level is a negative voltage level and the second voltage level is a positive voltage level.

4. The method of claim 3, wherein the second voltage level and the third voltage level have a same magnitude.

5. The method of claim 1, wherein generating an encoded stream comprises generating the encoded stream directly from the data stream.

6. A method for programming memory cells, the method comprising:
   generating an encoded stream directly from a data stream; and
   programming the memory cells using the encoded stream to represent the data stream;
   wherein a particular bit position of the encoded stream has a first voltage level when the particular bit position of the data stream has a particular logical state;
   wherein the particular bit position of the encoded stream has either a second voltage level or a third voltage level when the particular bit position of the data stream has a logical state other than the particular logical state; and
   wherein generating the encoded stream directly from the data stream comprises:
      assigning the first voltage level to the particular bit position of the encoded stream when the particular bit position of the data stream has the particular logical state;
      assigning the second voltage level to the particular bit position of the encoded stream when the particular bit position of the data stream has the logical state other than the particular logical state, and when a number of bit positions of the data stream having the particular logical state prior to the particular bit position of the data stream is an even number; and
      assigning the third voltage level to the particular bit position of the encoded stream when the particular bit position of the data stream has the logical state other than the particular logical state, and when the number of bit positions of the data stream having the particular logical state prior to the particular bit position of the data stream is an odd number.

7. A method for programming memory cells, the method comprising:
   generating an encoded stream using a data stream; and
   programming the memory cells using the encoded stream to represent the data stream;
   wherein a particular bit position of the encoded stream has a first voltage level when the particular bit position of the data stream has a particular logical state;
   wherein the particular bit position of the encoded stream has either a second voltage level or a third voltage level when the particular bit position of the data stream has a logical state other than the particular logical state; and
   wherein generating the encoded stream comprises:
      generating a first stream from the data stream, wherein the particular bit position of the first stream is generated from a logical combination of the logical state of a bit position of the first stream immediately prior to the particular bit position and the logical state of the particular bit position of the data stream;
      generating a second stream from the first stream, wherein a voltage level of the particular bit position of the second stream is generated as a function of a logical state of the particular bit position of the first stream; and
      generating the encoded stream from the second stream, wherein a voltage level of the particular bit position of the encoded stream is generated as a function of the voltage level of the particular bit position of the second stream and a voltage level of a bit position of the second stream immediately prior to the particular bit position.

8. The method of claim 7, wherein the logical combination of the logical state of the bit position of the first stream immediately prior to the particular bit position and the logical state of the particular bit position of the data stream is an exclusive OR combination.

9. The method of claim 7, wherein the function of the logical state of the particular bit position of the first stream comprises assigning a positive voltage level to the particular bit position of the second stream when the particular bit position of the first stream has the particular logical state and assigning a negative voltage level to the particular bit position of the second stream when the particular bit position of the first stream has the logical state other than the particular logical state.

10. The method of claim 7, wherein assigning a positive voltage level to the particular bit position of the second stream when the particular bit position of the first stream has the particular logical state and assigning a negative voltage level to the particular bit position of the second stream when the particular bit position of the first stream has the logical state other than the particular logical state comprises assigning voltage levels having a same magnitude.

11. The method of claim 7, wherein the function of the voltage level of the particular bit position of the second stream and the voltage level of the bit position of the second stream immediately prior to the particular bit position is an addition of the two voltage levels.

12. A method for programming memory cells, the method comprising:
   assigning a first voltage level to a particular bit position of a voltage stream when the particular bit position of a data stream has a particular logical state;
   assigning a second voltage level greater than the first voltage level to the particular bit position of the voltage stream when the particular bit position of the data stream has a logical state other than the particular logical state, and when a number of bit positions of the data stream having the particular logical state prior to the particular bit position is even;
   assigning a third voltage level less than the first voltage level to the particular bit position of the voltage stream when the particular bit position of the data stream has the logical state other than the particular logical state, and when the number of bit positions of the data stream having the particular logical state prior to the particular bit position is odd; and using the voltage stream to program the memory cells to represent the data stream.

13. The method of claim 12, wherein assigning the second voltage level and assigning the third voltage level comprises assigning voltage levels having opposite polarity and a same magnitude.

14. The method of claim 12, wherein assigning voltage levels to bit positions of the voltage stream comprises:

generating a first stream from the data stream, wherein the particular bit position of the first stream is an exclusive OR combination of the logical state of a bit position of the first stream immediately prior to the particular bit position and the logical state of the particular bit position of the data stream;

generating a second stream from the first stream, wherein a voltage level of the particular bit position of the second stream is a negative voltage level when the particular bit position of the first stream has the particular logical state, and wherein the voltage level of the particular bit position of the second stream is a positive voltage level when the particular bit position of the first stream has the logical state other than the particular logical state; and generating the voltage stream from the second stream, wherein a voltage level of the particular bit position of the voltage stream is an addition of the voltage level of the particular bit position of the second stream and a voltage level of the bit position of the second stream immediately prior to the particular bit position.

15. The method of claim 14, wherein the logical state of the bit position of the first stream immediately prior to the particular bit position is deemed to be the logical state other than the particular logical state when the particular bit position is the first bit position, and wherein the voltage level of the bit position of the second stream immediately prior to the particular bit position is deemed to be the positive voltage level when the particular bit position is the first bit position.

16. The method of claim 14, wherein adding voltage levels of two bit positions of the second stream generates the first voltage level when one bit position has the negative voltage level and the other bit position has the positive voltage level, generates the second voltage level when both bit positions have the positive voltage level, and generates the third voltage level when both bit positions have the negative voltage level.

17. A method for programming memory cells, the method comprising:

detecting a quantity of bit positions having a first data state preceding a present bit position in a data stream;

generating a first encoded state for a present bit position of an encoded stream when the present bit position of the data stream has the first data state;

generating a second encoded state for the present bit position of the encoded stream when the present bit position of the data stream has a second data state and when the present bit position of the data stream is preceded by an even number of bit positions in the data stream having the first data state;

generating a third encoded state for the present bit position of the encoded stream when the present bit position of the data stream has the second data state and when the present bit position of the data stream is preceded by an odd number of bit positions in the data stream having the first data state; and programming the memory cells using the encoded stream to represent the data stream.

18. The method of claim 17, wherein generating the first encoded state comprises generating a voltage level of 0V, wherein generating the second encoded state comprises generating a positive voltage level and wherein generating the third encoded state comprises generating a negative voltage level.

19. The method of claim 17, wherein generating the first encoded state comprises adding a positive voltage level and a negative voltage level, wherein generating the second encoded state comprises adding the positive voltage level and the positive voltage level, and wherein generating the third encoded state comprises adding the negative voltage level and the negative voltage level.

20. The method of claim 17, wherein the method is repeated for each bit position of the data stream.

* * * * *